(12) United States Patent
Lee et al.

(10) Patent No.: US 10,419,025 B2
(45) Date of Patent: Sep. 17, 2019

(54) SEMICONDUCTOR DEVICE

(71) Applicant: SK hynix Inc., Icheon-si, Gyeonggi-do (KR)

(72) Inventors: Jae In Lee, Icheon-si (KR); Yong Mi Kim, Hwaseong-si (KR)

(73) Assignee: SK hynix, Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/677,349

(22) Filed: Aug. 15, 2017

(65) Prior Publication Data

US 2018/0269901 A1    Sep. 20, 2018

(30) Foreign Application Priority Data

Mar. 20, 2017  (KR) .................. 10-2017-0034875

(51) Int. Cl.
| | | |
|---|---|---|
| *G11C 29/00* | (2006.01) | |
| *H03M 13/11* | (2006.01) | |
| *H03M 13/00* | (2006.01) | |
| *G06F 11/10* | (2006.01) | |
| *H03K 5/15* | (2006.01) | |

(52) U.S. Cl.
CPC ......... *H03M 13/1111* (2013.01); *G06F 11/10* (2013.01); *G06F 11/1048* (2013.01); *H03K 5/15* (2013.01); *H03M 13/611* (2013.01)

(58) Field of Classification Search
CPC .. H03M 13/1111; H03M 13/611; G06F 11/10; H03K 5/15
See application file for complete search history.

(56) References Cited

U.S. PATENT DOCUMENTS

| | | | | |
|---|---|---|---|---|
| 5,577,214 A | * | 11/1996 | Bhattacharya .......... | G06F 13/18 710/107 |
| 2014/0013184 A1 | * | 1/2014 | Takahashi ............... | G06F 11/10 714/763 |
| 2015/0318057 A1 | * | 11/2015 | Kim ..................... | G11C 29/026 714/757 |
| 2017/0331493 A1 | * | 11/2017 | Yu ....................... | H03M 13/098 |

FOREIGN PATENT DOCUMENTS

KR      1020100105697 A      9/2010

* cited by examiner

*Primary Examiner* — Samir W Rizk
(74) *Attorney, Agent, or Firm* — William Park & Associates Ltd.

(57) ABSTRACT

A semiconductor device may be provided. The semiconductor device may include an input and output (I/O) circuit configured to output transfer data generated from input data as internal data based on a write enablement signal and configured to output error information on the input data based on the write enablement signal. The generation of the write enablement signal may be based on a write signal which may be delayed by a delay time according to whether an error correction operation is performed.

20 Claims, 12 Drawing Sheets

FIG. 3

| OPERATION MODE | ECC_FIX | ECC_ON | TYCON |
|---|---|---|---|
| FIRST MODE | L | L | L |
| SECOND MODE | L | H | H |
| THIRD MODE | H | X | H |

SEMICONDUCTOR DEVICE

CROSS-REFERENCE TO RELATED APPLICATIONS

The present application claims priority under 35 U.S.C 119(a) to Korean Application No. 10-2017-0034875, filed on Mar. 20, 2017, which is incorporated herein by reference in its entirety.

BACKGROUND

1. Technical Field

Embodiments of the present disclosure may generally relate to a semiconductor device configured for executing an error correction operation.

2. Related Art

Recently, a DDR2 scheme or a DDR3 scheme receiving and outputting four-bit data or eight-bit data during each clock cycle time has been used to improve operation speeds of the semiconductor devices. If data transmission speeds of the semiconductor devices become faster, probability of error occurrence may increase while the data is transmitted within the semiconductor devices. Accordingly, novel design schemes may be required to guarantee reliable transmission of the data.

Whenever the data is transmitted within the semiconductor devices, error codes which are capable of detecting the occurrence of errors may be generated and transmitted with the data to improve the reliability of a data transmission. The error codes may include an error detection code (EDC) which is capable of detecting errors and an error correction code (ECC) which is capable of correcting the errors by itself.

SUMMARY

According to an embodiment, a semiconductor device may be provided. The semiconductor device may include an input and output (I/O) control circuit and an I/O circuit. The I/O control circuit may be configured to delay a write signal by a delay time to generate a write enablement signal. The I/O circuit may be configured to output transfer data generated from input data as internal data based on the write enablement signal. The I/O circuit may be configured to output a parity including error information on the input data as an internal parity based on the write enablement signal. The delay time may be controlled according to whether an error correction operation is performed.

According to an embodiment, a semiconductor device may be provided. The semiconductor device may include an input/output (I/O) control circuit, an error correction circuit and an I/O circuit. The I/O control circuit may be configured to delay a write signal by a delay time to generate a write enablement signal. The I/O control circuit may be configured to delay a read signal by the delay time to generate a read strobe signal. The error correction circuit may be configured to output input data as transfer data based on the write signal. The error correction circuit may be configured to output a parity including error information on the input data based on the write signal. The error correction circuit may be configured to correct errors of internal data according to an internal parity to output the corrected internal data as the transfer data based on the read signal. The I/O circuit may be configured to output the transfer data as the internal data based on the write enablement signal. The I/O circuit may be configured to output the parity as the internal parity based on the write enablement signal. The I/O circuit may be configured to output the internal data as output data based on the read strobe signal. The delay time may be controlled according to whether an error correction operation is performed.

According to an embodiment, a semiconductor device may be provided. The semiconductor device may include an input and output (I/O) circuit configured to output transfer data generated from input data as internal data based on a write enablement signal and configured to output error information on the input data based on the write enablement signal. The generation of the write enablement signal may be based on a write signal which may be delayed by a delay time according to whether an error correction operation is performed.

BRIEF DESCRIPTION OF THE DRAWINGS

FIG. 3 is a table illustrating an operation of the delay control signal generation circuit illustrated in FIG. 2.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices executing an error correction operation.

For reference, an embodiment including additional components may be provided. Furthermore, an logic high or logic low configuration indicating an active state of a signal or circuit may be changed depending on embodiments.

Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

For reference, an embodiment including additional components may be provided. Furthermore, an logic high or logic low configuration indicating a logic state of a signal or circuit may be changed depending on embodiments. Furthermore, the configuration of a transistor required for implementing the same function may be modified. That is, the configuration of the PMOS transistor and the configuration of the NMOS transistor may be replaced with each other, depending on a specific situation. If necessary, various transistors may be applied to implement the configurations.

Figure 1:
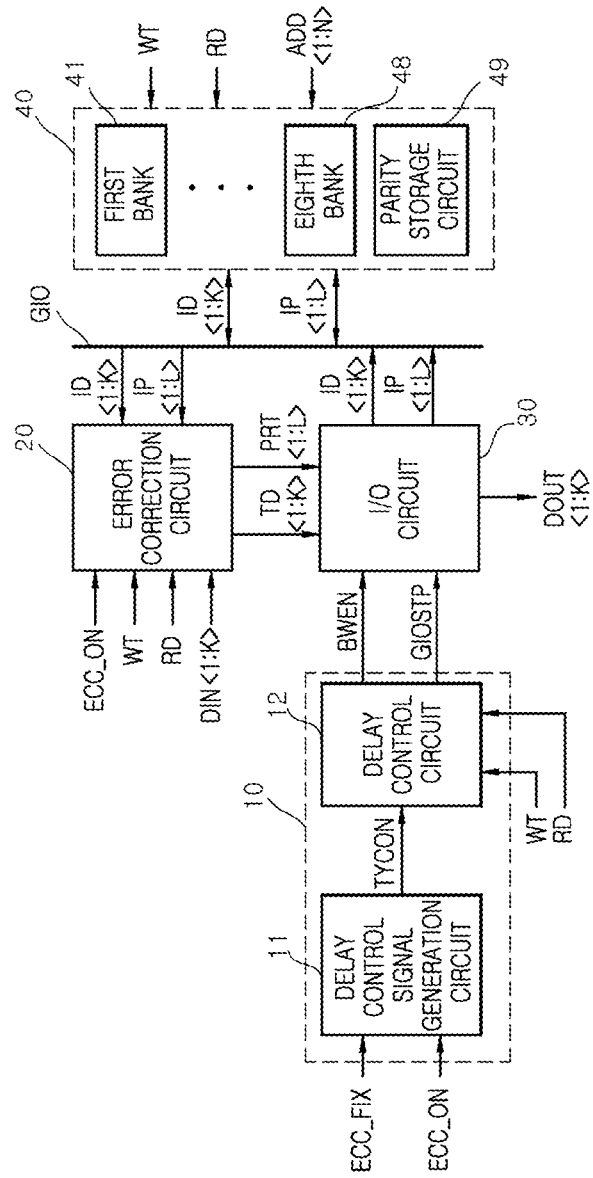
FIG. 1 is a block diagram illustrating a configuration of a semiconductor device according to an embodiment of the present disclosure.

Referring to FIG. 1, a semiconductor device according to an embodiment may include an I/O control circuit 10, an error correction circuit 20, an I/O circuit 30 and a memory circuit 40. The I/O control circuit 10 may include a delay control signal generation circuit 11 and a delay control circuit 12.

The delay control signal generation circuit 11 may generate a delay control signal TYCON which is enabled according to a logic level combination of an error correction fix signal ECC_FIX and an error correction start signal ECC_ON. The delay control signal generation circuit 11 may generate the delay control signal TYCON which is selectively enabled according to a logic level of the error correction start signal ECC_ON if the error correction fix signal ECC_FIX is disabled. The delay control signal generation circuit 11 may generate the delay control signal TYCON which is enabled if the error correction fix signal ECC_FIX is enabled. A logic level of the enabled delay control signal TYCON may be set to be different according to the embodiments. A configuration and an operation of the delay control signal generation circuit 11 will be described with reference to FIGS. 2 and 3 later.

The delay control circuit 12 may delay a write signal WT by a delay time which is set according to the delay control signal TYCON to generate a write enablement signal BWEN and may delay a read signal RD by a delay time which is set according to the delay control signal TYCON to generate a read strobe signal GIOSTP. The delay control circuit 12 may delay the write signal WT by a first delay time to generate the write enablement signal BWEN if the delay control signal TYCON is disabled. The delay control circuit 12 may delay the write signal WT by a second delay time to generate the write enablement signal BWEN if the delay control signal TYCON is enabled. The delay control circuit 12 may delay the read signal RD by the first delay time to generate the read strobe signal GIOSTP if the delay control signal TYCON is disabled. The delay control circuit 12 may delay the read signal RD by the second delay time to generate the read strobe signal GIOSTP if the delay control signal TYCON is enabled. The second delay time may set to be longer than the first delay time. The second delay time may be set to be equal to a time for generating a parity PRT<1:L> in the error correction circuit 20 which is described later. The second delay time may be set to be equal to a time for correcting an error of internal data ID<1:K> according to an internal parity IP<1:L> in the error correction circuit 20 which is described later. An operation for generating the parity PRT<1:L> and an operation for correcting the error of the internal data ID<1:K> according to the internal parity IP<1:L> may be set as an error correction operation. The error correction fix signal ECC_FIX may be set as a signal for fixing a delay time of the delay control circuit 12, regardless of an operation of the error correction circuit 20. The error correction start signal ECC_ON may be set as a signal that drives the error correction circuit 20 to execute the error correction operation. A configuration and an operation of the delay control circuit 12 will be described with reference to FIGS. 4 to 7 later.

The write enablement signal BWEN and the read strobe signal GIOSTP may be set as column signals for controlling column paths of the semiconductor device.

As described above, the I/O control circuit 10 may delay the write signal WT by a delay time which is set according to a logic level combination of the error correction fix signal ECC_FIX and the error correction start signal ECC_ON to generate the write enablement signal BWEN. The I/O control circuit 10 may delay the read signal RD by the delay time which is set according to a logic level combination of the error correction fix signal ECC_FIX and the error correction start signal ECC_ON to generate the read strobe signal GIOSTP.

The error correction circuit 20 may output input data DIN<1:K> as transfer data TD<1:K> during a write operation. The error correction circuit 20 may generate a parity PRT<1:L> including error information of the input data DIN<1:K> during the write operation. The error correction circuit 20 may output the input data DIN<1:K> as the transfer data TD<1:K> in response to the write signal WT. The error correction circuit 20 may output the parity PRT<1:L> including error information of the input data DIN<1:K> in response to the write signal WT and the error correction start signal ECC_ON. The error correction circuit 20 may output the internal data ID<1:K> as the transfer data TD<1:K> during a read operation. The error correction circuit 20 may correct errors of the internal data ID<1:K> according to the internal parity IP<1:L> during the read operation. The error correction circuit 20 may output the internal data ID<1:K> as the transfer data TD<1:K> in response to the read signal RD. The error correction circuit 20 may correct errors of the internal data ID<1:K> according to the internal parity IP<1:L> to output the corrected data as the transfer data TD<1:K> in response to the read signal RD and the error correction start signal ECC_ON. The error correction circuit 20 may be realized using a general error correction code (ECC) circuit that employs an ECC scheme.

The I/O circuit 30 may output the transfer data TD<1:K> as the internal data ID<1:K> during the write operation. The I/O circuit 30 may output the parity PRT<1:L> as the internal parity IP<1:L> during the write operation. The I/O circuit 30 may output the internal data ID<1:K> and the internal parity IP<1:L> to an I/O line GIO during the write operation. The I/O circuit 30 may output the transfer data TD<1:K> as the internal data ID<1:K> in response to the write enablement signal BWEN. The I/O circuit 30 may output parity PRT<1:L> as the internal parity IP<1:L> in response to the write enablement signal BWEN. The I/O circuit 30 may output the transfer data TD<1:K> as output data DOUT<1:K> during the read operation. The I/O circuit 30 may output the output data DOUT<1:K> to an external device during the read operation. The I/O circuit 30 may output the transfer data TD<1:K> as output data DOUT<1:K> in response to the read strobe signal GIOSTP. A configuration and an operation of the I/O circuit 30 will be described with reference to FIGS. 8 to 10 later.

The memory circuit 40 may include first to eighth banks 41~48 and a parity storage circuit 49. The memory circuit 40 may store the internal data ID<1:K> loaded on the I/O line GIO into one of the first to eighth banks 41~48, which is selected during the write operation. The memory circuit 40 may store the internal parity IP<1:L> loaded on the I/O line GIO into the parity storage circuit 49 during the write operation. The memory circuit 40 may store the internal data ID<1:K> loaded on the I/O line GIO into one of the first to eighth banks 41~48, which is selected according to a logic level combination of an address ADD<1:N>, in response to the write signal WT. The parity storage circuit 49 of the memory circuit 40 may store the internal parity IP<1:L> loaded on the I/O line GIO in response to the write signal WT. The memory circuit 40 may output the internal data ID<1:K> stored in any one of the first to eighth banks 41~48, which is selected during the read operation, to the I/O line GIO. The memory circuit 40 may output the internal parity IP<1:L> stored in the parity storage circuit 49 to the I/O line GIO during the read operation. The memory circuit 40 may output the internal data ID<1:K> stored in any one of the first to eighth banks 41~48, which is selected according to a logic level combination of the address ADD<1:N>, to the I/O line GIO in response to the read signal RD. The parity storage circuit 49 of the memory circuit 40 may output the internal parity IP<1:L> stored therein to the I/O line GIO in response to the read signal RD. Although FIG. 1 illustrates an example in which the memory circuit 40 includes eight banks, the present disclosure is not limited thereto. For example, the number of the banks included in the memory circuit 40 may be set to be different according to the embodiments. The number "N" of bits included in the address ADD<1:N> may be set to be different according to the number of the banks.

Figure 2:
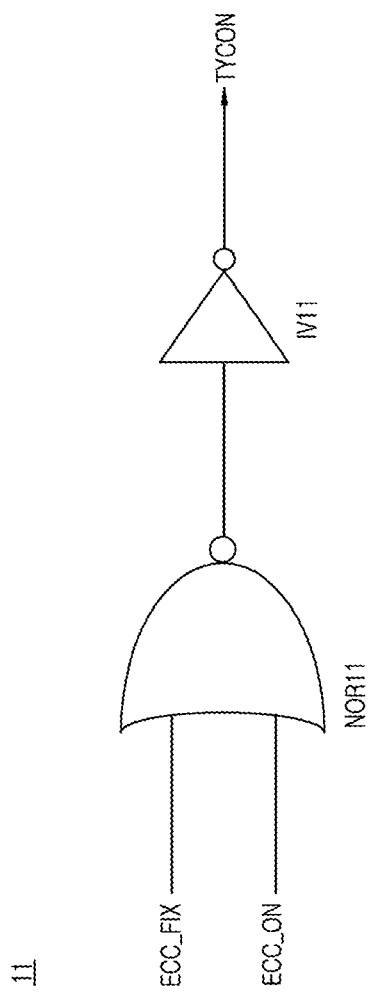
FIG. 2 is a circuit diagram illustrating a delay control signal generation circuit included in the semiconductor device of FIG. 1.

Referring to FIG. 2, the delay control signal generation circuit 11 may be configured to include a NOR operator and invertor, for example but not limited to, a NOR gate NOR11 and an inverter IV11.

The delay control signal generation circuit 11 may generate the delay control signal TYCON which is enabled according to a logic level combination of the error correction fix signal ECC_FIX and the error correction start signal ECC_ON. The delay control signal generation circuit 11 may perform an OR operation of the error correction fix signal ECC_FIX and the error correction start signal ECC_ON to generate the delay control signal TYCON. The delay control signal generation circuit 11 may generate the delay control signal TYCON which is enabled to have a logic "high(H)" level if any one of the error correction fix signal ECC_FIX and the error correction start signal ECC_ON has a logic "high(H)" level.

Operation modes set according to a logic level combination of the error correction fix signal ECC_FIX and the error correction start signal ECC_ON and logic levels of the error correction fix signal ECC_FIX and the error correction start signal ECC_ON for generating the delay control signal TYCON will be described hereinafter with reference to FIG. 3.

In the case of a first mode, the error correction fix signal ECC_FIX may have a logic "low(L)" level and the error correction start signal ECC_ON may have a logic "low(L)" level.

In the first mode, the delay control signal generation circuit 11 may perform an OR operation of the error correction fix signal ECC_FIX having a logic "low(L)" level and the error correction start signal ECC_ON having a logic "low(L)" level to generate the delay control signal TYCON which is disabled to have a logic "low(L)" level.

The first mode is an operation mode in which the error correction operation for generating the parity PRT<1:L> and for correcting errors of the internal data ID<1:K> is not performed.

In the case of a second mode, the error correction fix signal ECC_FIX may have a logic "low(L)" level and the error correction start signal ECC_ON may have a logic "high(H)" level.

In the second mode, the delay control signal generation circuit 11 may perform an OR operation of the error correction fix signal ECC_FIX having a logic "low(L)" level and the error correction start signal ECC_ON having a logic "high(H)" level to generate the delay control signal TYCON which is enabled to have a logic "high(H)" level.

The second mode is an operation mode in which the error correction operation for generating the parity PRT<1:L> and for correcting errors of the internal data ID<1:K> is performed.

In case of a third mode, the error correction fix signal ECC_FIX may have a logic "high(H)" level. In such a case, the error correction start signal ECC_ON may have a logic "low(L)" level or a logic "high(H)" level. The error correction circuit 20 may be driven if the error correction start signal ECC_ON has a logic "high(H)" level, and the error correction circuit 20 may not be driven not to perform the error correction operation if the error correction start signal ECC_ON has a logic "low(L)" level.

In the third mode, the delay control signal generation circuit 11 may perform an OR operation of the error correction fix signal ECC_FIX having a logic "high(H)" level and the error correction start signal ECC_ON having a logic "low(L)" level or a logic "high(H)" level (i.e., X) to generate the delay control signal TYCON which is enabled to have a logic "high(H)" level.

The third mode is an operation mode for fixing a delay time of the delay control circuit 12 regardless of the error correction operation of the error correction circuit 20.

Figure 4:
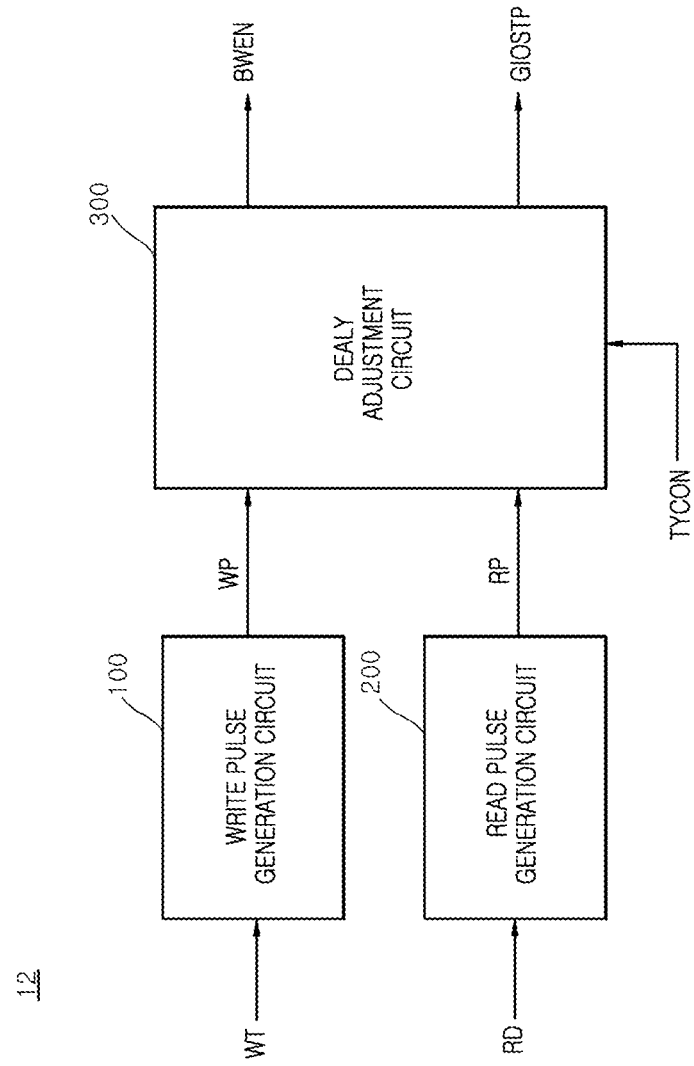
FIG. 4 is a block diagram illustrating a configuration of a delay control circuit included in the semiconductor device of FIG. 1.

Referring to FIG. 4, the delay control circuit 12 may include a write pulse generation circuit 100, a read pulse generation circuit 200 and a delay adjustment circuit 300.

The write pulse generation circuit 100 may generate a write pulse WP having a predetermined pulse width in response to the write signal WT. The write pulse generation circuit 100 may generate the write pulse WP having a logic "high(H)" level during a predetermined period if the write signal WT enabled to have a logic "high(H)" level is inputted to the write pulse generation circuit 100. A logic level of the enabled write signal WT and a logic level of the write pulse WP may be set to be different according to the embodiments.

The read pulse generation circuit 200 may generate a read pulse RP having a predetermined pulse width in response to the read signal RD. The read pulse generation circuit 200 may generate the read pulse RP having a logic "high(H)" during a predetermined period if the read signal RD enabled to have a logic "high(H)" level is inputted to the read pulse generation circuit 200. A logic level of the enabled read signal RD and a logic level of the read pulse RP may be set to be different according to the embodiments.

The delay adjustment circuit 300 may delay the write pulse WP by a delay time, which is set in response to the delay control signal TYCON, to generate the write enablement signal BWEN. The delay adjustment circuit 300 may delay the write pulse WP by a first delay time to generate the write enablement signal BWEN if the delay control signal TYCON is disabled to have a logic "low(L)" level. The delay adjustment circuit 300 may delay the write pulse WP by a second delay time to generate the write enablement signal BWEN if the delay control signal TYCON is enabled to have a logic "high(H)" level. The delay adjustment circuit 300 may delay the read pulse RP by a delay time, which is set in response to the delay control signal TYCON, to generate the read strobe signal GIOSTP. The delay adjustment circuit 300 may delay the read pulse RP by the first delay time to generate the read strobe signal GIOSTP if the delay control signal TYCON is disabled to have a logic "low(L)" level. The delay adjustment circuit 300 may delay the read pulse RP by the second delay time to generate the read strobe signal GIOSTP if the delay control signal TYCON is enabled to have a logic "high(H)" level. Further, the logic levels of the signals may be different from or the opposite of those described. For example, a signal described as having a logic "high(H)" level may alternatively have a logic "low(L)" level, and a signal described as having a logic "low" level may alternatively have a logic "high" level.

Figure 5:
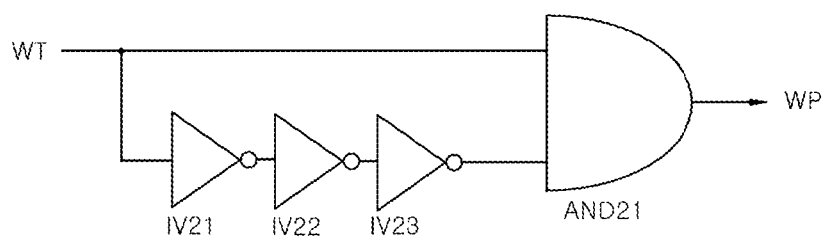
FIG. 5 is a circuit diagram illustrating a write pulse generation circuit included in the delay control circuit of FIG. 4.

Referring to FIG. 5, the write pulse generation circuit 100 may be configured to include inverters inversion operators and AND operators, for example but not limited to, inverters IV21, IV22 and IV23 and an AND gate AND21.

The write pulse generation circuit 100 may generate the write pulse WP having a logic "high(H)" level during a predetermined period if the write signal WT having a logic "high(H)" level is inputted to the write pulse generation circuit 100. The write pulse generation circuit 100 may be realized using a general pulse generation circuit.

Figure 6:
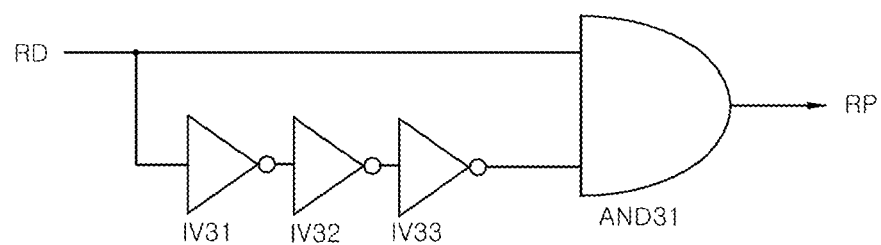
FIG. 6 is a circuit diagram illustrating a read pulse generation circuit included in the delay control circuit of FIG. 4.

Referring to FIG. 6, the read pulse generation circuit 200 may be configured to include inversion operators and AND operators, for example but not limited to, inverters IV31, IV32 and IV33 and an AND gate AND31.

The read pulse generation circuit 200 may generate the read pulse RP having a logic "high(H)" level during a predetermined period if the read signal RD having a logic "high(H)" level is inputted to the read pulse generation circuit 200. The read pulse generation circuit 200 may be realized using a general pulse generation circuit.

Figure 7:
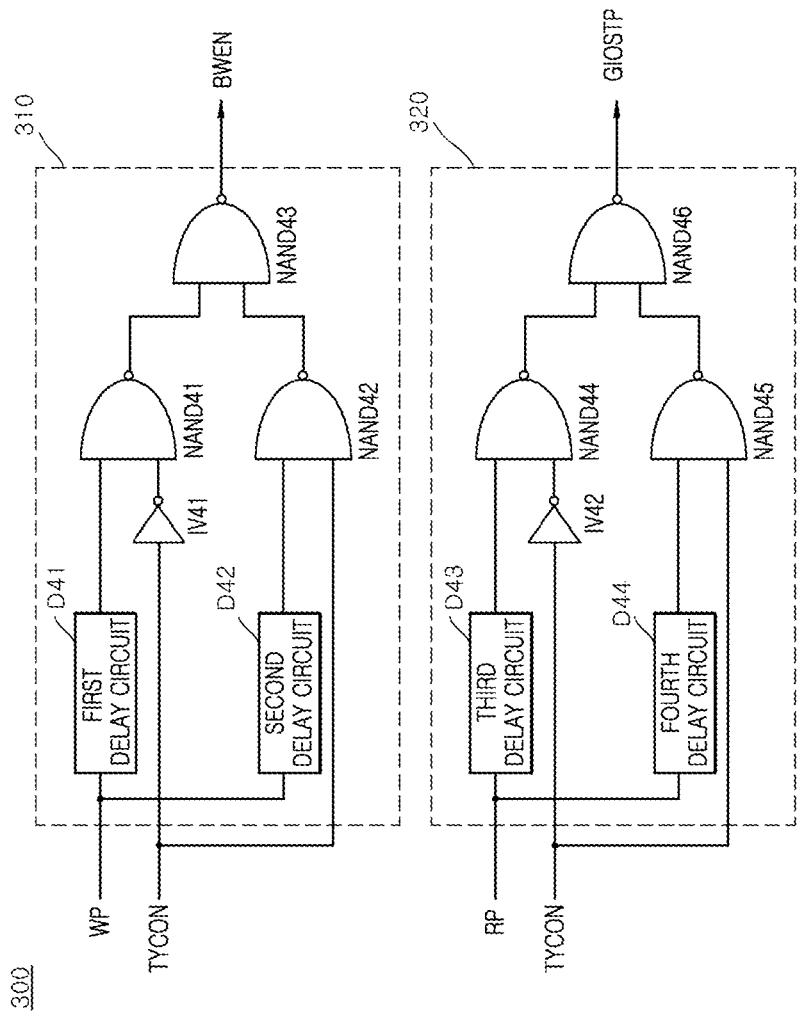
FIG. 7 is a circuit diagram illustrating a delay adjustment circuit included in the delay control circuit of FIG. 4.

Referring to FIG. 7, the delay adjustment circuit 300 may include a first delay adjustment circuit 310 and a second delay adjustment circuit 320.

The first delay adjustment circuit 310 may be configured to include a first delay circuit D41, a second delay circuit D42, an inversion operator, for example but not limited to, an inverter IV41 and NAND operators, for example but not limited to, NAND gates NAND41, NAND42 and NAND43. The first delay adjustment circuit 310 may delay the write pulse WP with the first delay circuit D41 and the NAND gates NAND41 and NAND43 to generate the write enablement signal BWEN if the delay control signal TYCON is disabled to have a logic "low(L)" level. The first delay adjustment circuit 310 may delay the write pulse WP with the second delay circuit D42 and the NAND gates NAND42 and NAND43 to generate the write enablement signal BWEN if the delay control signal TYCON is enabled to have a logic "high(H)" level. A delay time of the first delay circuit D41 may be set as the first delay time mentioned above, and a delay time of the second delay circuit D42 may be set as the second delay time mentioned above.

The second delay adjustment circuit 320 may be configured to include a third delay circuit D43, a fourth delay circuit D44, inversion operator, for example but not limited to, an inverter IV42 and NAND operators, for example but not limited to, NAND gates NAND44, NAND45 and NAND46. The second delay adjustment circuit 320 may delay the read pulse WP with the third delay circuit D43 and the NAND gates NAND44 and NAND46 to generate the read strobe signal GIOSTP if the delay control signal TYCON is disabled to have a logic "low(L)" level. The second delay adjustment circuit 320 may delay the read pulse RP with the fourth delay circuit D44 and the NAND gates NAND45 and NAND46 to generate the read strobe signal GIOSTP if the delay control signal TYCON is enabled to have a logic "high(H)" level. A delay time of the third delay circuit D43 may be set as the first delay time mentioned above, and a delay time of the fourth delay circuit D44 may be set as the second delay time mentioned above.

Figure 8:
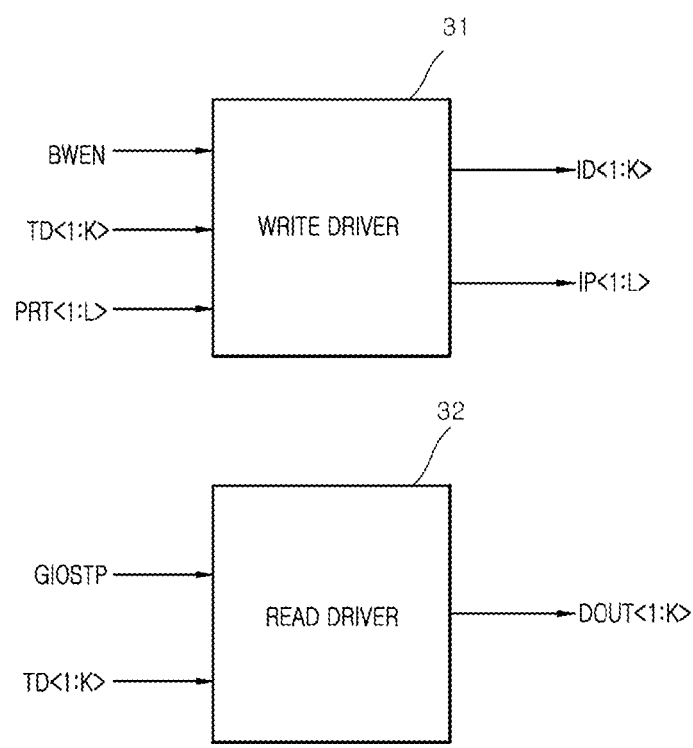
FIG. 8 is a block diagram illustrating a configuration of an input/output (I/O) circuit included in the semiconductor device of FIG. 1.

Referring to FIG. 8, the I/O circuit 30 may include a write driver 31 and a read driver 32.

The write driver 31 may output the transfer data TD<1:K> as the internal data ID<1:K> in response to the write enablement signal BWEN. The write driver 31 may output the transfer data TD<1:K> as the internal data ID<1:K> if the write enablement signal BWEN is enabled to have a logic "high(H)" level. The write driver 31 may output the parity PRT<1:L> as the internal parity IP<1:L> in response to the write enablement signal BWEN. The write driver 31 may output the parity PRT<1:L> as the internal parity IP<1:L> if the write enablement signal BWEN is enabled to have a logic "high(H)" level. The write driver 31 may output the internal data ID<1:K> to the I/O line (GIO of FIG. 1). The write driver 31 may output the internal parity IP<1:L> to the I/O line (GIO of FIG. 1).

The read driver 32 may output the transfer data TD<1:K> as the output data DOUT<1:K> in response to the read strobe signal GIOSTP. The read driver 32 may output the transfer data TD<1:K> as the output data DOUT<1:K> if the read strobe signal GIOSTP is enabled to have a logic "high(H)" level.

Figure 9:
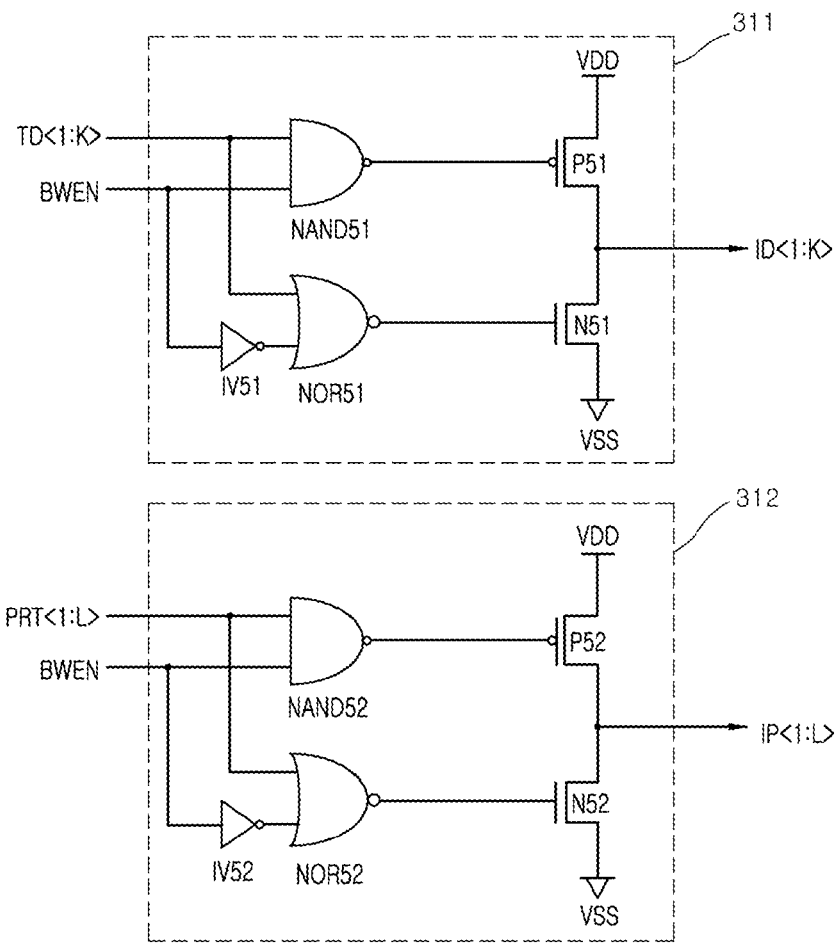
FIG. 9 is a circuit diagram illustrating a write driver included in the I/O circuit of FIG. 8.

Referring to FIG. 9, the write driver 31 may include a first write driver 311 and a second write driver 312.

The first write driver 311 may be configured to include an inversion operator, a NAND operator, a NOR operator, and transistors. In an embodiment, a first write driver 311 may be configured to include, for example but not limited to, an inverter IV51, a NAND gate NAND51, a NOR gate NOR51, a PMOS transistor P51 and an NMOS transistor N51. The first write driver 311 may output the transfer data TD<1:K> as the internal data ID<1:K> if the write enablement signal BWEN is enabled to have a logic "high(H)" level. In FIG. 9, the first write driver 311 is illustrated with a single circuit comprised of the inverter IV51, the NAND gate NAND51, the NOR gate NOR51, the PMOS transistor P51 and the NMOS transistor N51. However, the first write driver 311 may be actually configured to include the same number of circuits as the bits included in the transfer data TD<1:K> or the internal data ID<1:K>. That is, if the transfer data TD<1:K> or the internal data ID<1:K> have "K"-number of bits, the first write driver 311 may be configured to include "K"-number of circuits, each of which is comprised of the inverter IV51, the NAND gate NAND51, the NOR gate NOR51, the PMOS transistor P51 and the NMOS transistor N51. The PMOS transistor P51 may be coupled between a supply voltage VDD and the NMOS transistor N51. The NMOS transistor N51 may be coupled between a ground voltage VSS and the PMOS transistor P51.

The second write driver 312 may be configured to include an inversion operator, a NAND operator, a NOR operator, and transistors. In an embodiment, a second write driver 312 may be configured to include, for example but not limited to, an inverter IV52, a NAND gate NAND52, a NOR gate NOR52, a PMOS transistor P52 and an NMOS transistor N52. The second write driver 312 may output the parity PRT<1:L> as the internal parity IP<1:L> if the write enablement signal BWEN is enabled to have a logic "high(H)" level. In FIG. 9, the second write driver 312 is illustrated with a single circuit comprised of the inverter IV52, the NAND gate NAND52, the NOR gate NOR52, the PMOS transistor P52 and the NMOS transistor N52. However, the second write driver 312 may be actually configured to include the same number of circuits as the bits included in the parity PRT<1:L> or the internal parity IP<1:L>. That is, if the parity PRT<1:L> or the internal parity IP<1:L> have "L"-number of bits, the second write driver 312 may be configured to include "L"-number of circuits, each of which is comprised of the inverter IV52, the NAND gate NAND52, the NOR gate NOR52, the PMOS transistor P52 and the NMOS transistor N52. The PMOS transistor P52 may be coupled between a supply voltage VDD and the NMOS transistor N52. The NMOS transistor N52 may be coupled between a ground voltage VSS and the PMOS transistor P52.

Figure 10:
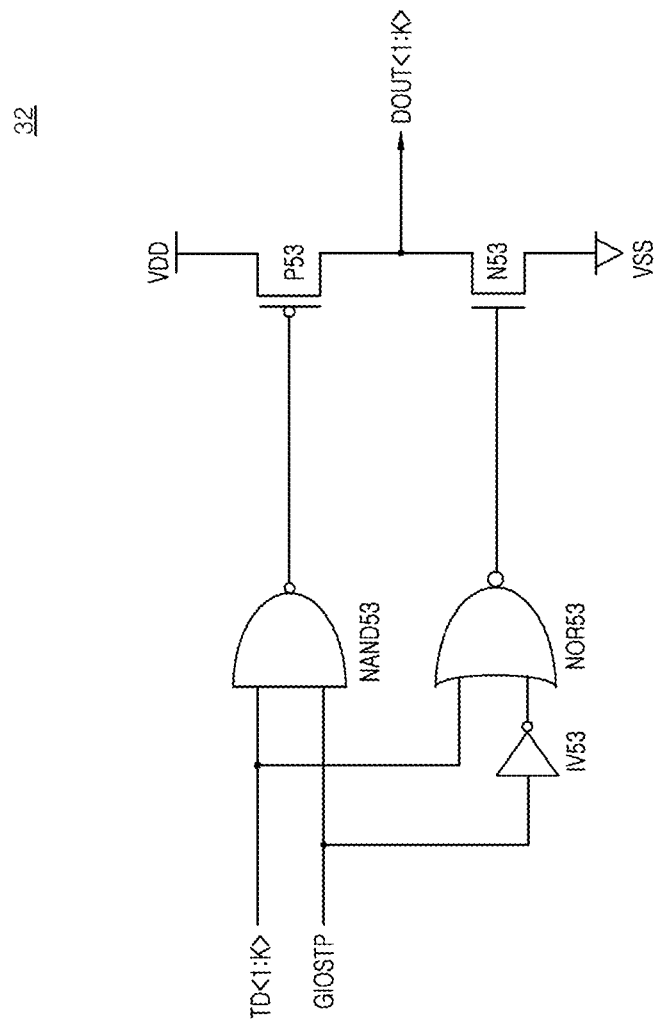
FIG. 10 is a circuit diagram illustrating a read driver included in the I/O circuit of FIG. 8.

Referring to FIG. 10, the read driver 32 may be configured to include an inversion operator, a NAND operator, a NOR operator, and transistors. In an embodiment, a read driver 32 may be configured to include, for example but not limited to, an inverter IV53, a NAND gate NAND53, a NOR gate NOR53, a PMOS transistor P53 and an NMOS transistor N53. The read driver 32 may output the transfer data TD<1:K> as the output data DOUT<1:K> if the read strobe signal GIOSTP is enabled to have a logic "high(H)" level. In FIG. 10, the read driver 32 is illustrated with a single circuit comprised of the inverter IV53, the NAND gate NAND53, the NOR gate NOR53, the PMOS transistor P53 and the NMOS transistor N53. However, the read driver 32 may be actually configured to include the same number of circuits as the bits included in the transfer data TD<1:K> or the output data DOUT<1:K>. That is, if the transfer data TD<1:K> or the output data DOUT<1:K> have "K"-number of bits, the read driver 32 may be configured to include "K"-number of circuits, each of which is comprised of the inverter IV53, the NAND gate NAND53, the NOR gate NOR53, the PMOS transistor P53 and the NMOS transistor N53. The PMOS transistor P53 may be coupled between a supply voltage VDD and the NMOS transistor N53. The NMOS transistor N53 may be coupled between a ground voltage VSS and the PMOS transistor P53.

The write operations in the various operation modes of a semiconductor device according to an embodiment will be described hereinafter with reference to FIGS. 1 to 10.

First, the write operation in the first mode that the error correction circuit 20 does not perform the error correction operation will be described hereinafter.

In case of the first mode, the error correction fix signal ECC_FIX may have a logic "low(L)" level and the error correction start signal ECC_ON may also have a logic "low(L)" level.

The delay control signal generation circuit 11 may perform an OR operation of the error correction fix signal ECC_FIX having a logic "low(L)" level and the error correction start signal ECC_ON having a logic "low(L)" level to generate the delay control signal TYCON which is disabled to have a logic "low(L)" level.

The delay control circuit 12 may delay the write signal WT by the first delay time determined according to the delay control signal TYCON having a logic "low(L)" level to generate the write enablement signal BWEN. The first delay time may correspond to a delay time of the first delay circuit D41 illustrated in FIG. 7.

The error correction circuit 20 may output the input data DIN<1:K> as the transfer data TD<1:K> in response to the write signal WT. The error correction circuit 20 may not perform the error correction operation generating the parity PRT<1:L> in response to the error correction start signal ECC_ON having a logic "low(L)" level.

The I/O circuit 30 may output the transfer data TD<1:K> as the internal data ID<1:K> through the I/O line GIO, in response to the write enablement signal BWEN.

The memory circuit 40 may store the internal data ID<1:K> loaded on the I/O line GIO into any one of the first to eighth banks 41~48, which is selected according to a logic level combination of the address ADD<1:N>, in response to the write signal WT.

As described above, the semiconductor device according to an embodiment may reduce a delay time of the delay control signal TYCON for generating the write enablement signal BWEN if the error correction operation is not performed. Thus, a timing margin between the transfer data TD<1:K> generated from the input data DIN<1:K> and the write enablement signal BWEN may increase to obtain a sufficient valid window of data during the write operation or the read operation.

Next, the write operation in the second mode that the error correction circuit 20 performs the error correction operation will be described hereinafter.

In case of the second mode, the error correction fix signal ECC_FIX may have a logic "low(L)" level and the error correction start signal ECC_ON may have a logic "high(H)" level.

The delay control signal generation circuit 11 may perform an OR operation of the error correction fix signal ECC_FIX having a logic "low(L)" level and the error correction start signal ECC_ON having a logic "high(H)" level to generate the delay control signal TYCON which is enabled to have a logic "high(H)" level.

The delay control circuit 12 may delay the write signal WT by the second delay time determined according to the delay control signal TYCON having a logic "high(H)" level to generate the write enablement signal BWEN. The second delay time may correspond to a delay time of the second delay circuit D42 illustrated in FIG. 7.

The error correction circuit 20 may output the input data DIN<1:K> as the transfer data TD<1:K> in response to the write signal WT. The error correction circuit 20 may perform the error correction operation generating the parity PRT<1:L> including error information of the input data DIN<1:K> in response to the error correction start signal ECC_ON having a logic "high(H)" level.

The I/O circuit 30 may output the transfer data TD<1:K> as the internal data ID<1:K> through the I/O line GIO, in response to the write enablement signal BWEN. The I/O circuit 30 may output the parity PRT<1:L> as the internal parity IP<1:L> through the I/O line GIO, in response to the write enablement signal BWEN.

The memory circuit 40 may store the internal data ID<1:K> loaded on the I/O line GIO into any one of the first to eighth banks 41~48, which is selected according to a logic level combination of the address ADD<1:N>, in response to the write signal WT. The parity storage circuit 49 of the memory circuit 40 may store the internal parity IP<1:L> loaded on the I/O line GIO therein in response to the write signal WT.

As described above, the semiconductor device according to an embodiment may set a delay time of the delay control signal TYCON for generating the write enablement signal BWEN so that the delay time of the delay control signal TYCON is equal to a time period that the error correction operation is performed, if the error correction operation is performed. Thus, a timing margin between the parity PRT<1:L> and the transfer data TD<1:K> generated from the input data DIN<1:K> and the write enablement signal BWEN may increase to obtain a sufficient valid window of data during the write operation.

Next, the write operation in the third mode for fixing a delay time of the delay control circuit 12 regardless of the operation of the error correction circuit 20 will be described hereinafter in conjunction with an example in which the error correction circuit 20 does not perform the error correction operation.

In case of the third mode, the error correction fix signal ECC_FIX may have a logic "high(H)" level and the error correction start signal ECC_ON may have a logic "low(L)" level.

In the third mode, the delay control signal generation circuit 11 may perform an OR operation of the error correction fix signal ECC_FIX having a logic "high(H)" level and the error correction start signal ECC_ON having a logic "low(L)" level to generate the delay control signal TYCON which is enabled to have a logic "high(H)" level.

The delay control circuit 12 may delay the write signal WT by the second delay time determined according to the delay control signal TYCON having a logic "high(H)" level to generate the write enablement signal BWEN. The second delay time may correspond to a delay time of the second delay circuit D42 illustrated in FIG. 7.

The error correction circuit 20 may output the input data DIN<1:K> as the transfer data TD<1:K> in response to the write signal WT. The error correction circuit 20 may not perform the error correction operation generating the parity PRT<1:L> in response to the error correction start signal ECC_ON having a logic "low(L)" level.

The I/O circuit 30 may output the transfer data TD<1:K> as the internal data ID<1:K> through the I/O line GIO, in response to the write enablement signal BWEN.

The memory circuit 40 may store the internal data ID<1:K> loaded on the I/O line GIO into any one of the first to eighth banks 41~48, which is selected according to a logic level combination of the address ADD<1:N>, in response to the write signal WT.

As described above, the semiconductor device according to an embodiment may fix a delay time of the delay control signal TYCON for generating the write enablement signal BWEN regardless of the error correction operation. Thus, the semiconductor device may generate the column signals having the same delay time.

The semiconductor device having an aforementioned configuration may control delay times of the delay control signal TYCON for generating the write enablement signal BWEN and the read strobe signal GIOSTP corresponding to the column signals according to whether the error correction operation is performed, thereby obtaining a sufficient valid window of data during the write operation and the read operation. In addition, the semiconductor device may fix a delay time of the delay control signal TYCON for generating the write enablement signal BWEN and the read strobe signal GIOSTP corresponding to the column signals regardless of execution of the error correction operation, thereby generating the column signals having the same delay time.

Figure 11:
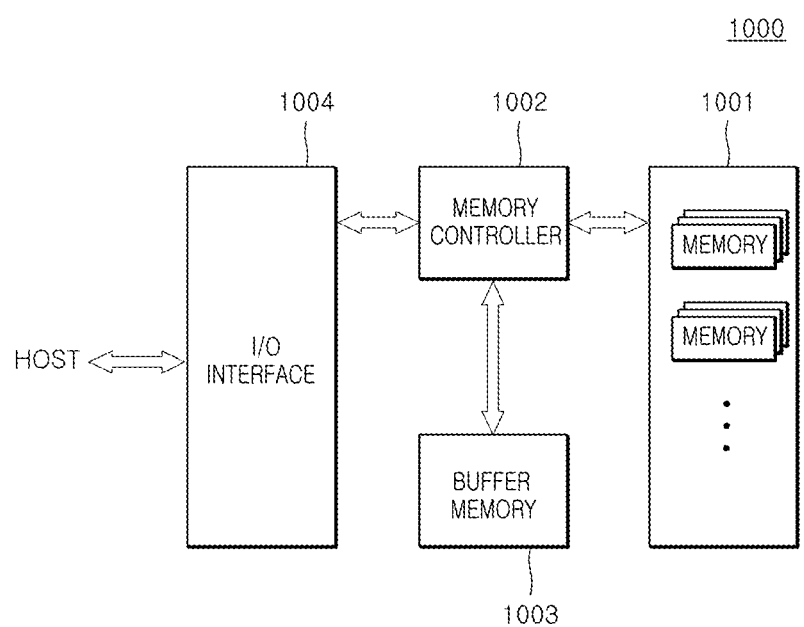
FIG. 11 is a block diagram illustrating a configuration of an electronic system employing the semiconductor device described with reference to FIGS. 1 to 10.

The semiconductor device described with reference to FIGS. 1 to 10 may be applied to an electronic system that includes a memory system, a graphic system, a computing system, a mobile system, or the like. For example, as illustrated in FIG. 11, an electronic system 1000 according an embodiment may include a data storage circuit 1001, a memory controller 1002, a buffer memory 1003, and an input and output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 11 illustrates the memory controller 1002 with a single block, the memory controller 1002 may include one controller for controlling the data storage circuit 1001 comprised of a nonvolatile memory and another controller for controlling the buffer memory 1003 comprised of a volatile memory. In an embodiment, for example, the memory controller 1002 may include the semiconductor device illustrated in FIG. 1.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 12:
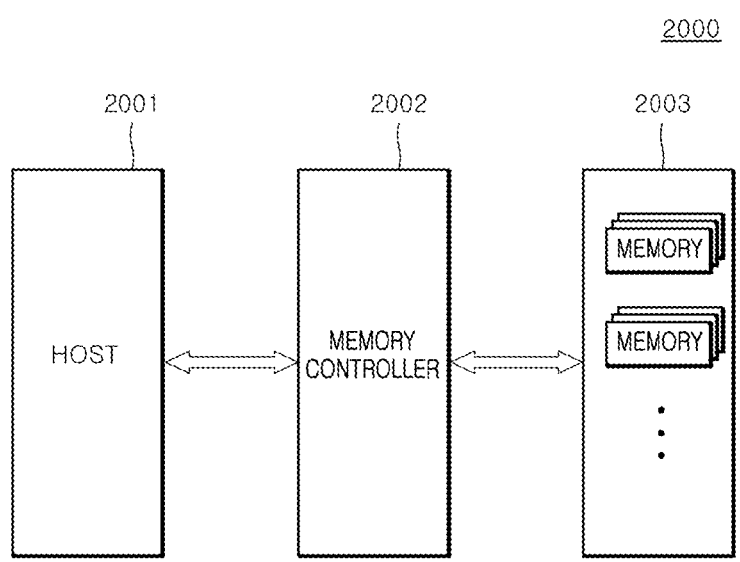
FIG. 12 is a block diagram illustrating a configuration of another electronic system employing the semiconductor device described with reference to FIGS. 1 to 10.

Referring to FIG. 12, an electronic system 2000 according an embodiment may include a host 2001, a memory controller 2002 and a data storage circuit 2003.

The host 2001 may output a request signal and data to the memory controller 2002 to access to the data storage circuit 2003. The memory controller 2002 may supply the data, a data strobe signal, a command, addresses and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme. The host 2001 may include an error correction circuit 20 illustrated in FIG. 1. In an embodiment, for example, the host 2001 may include the semiconductor device illustrated in FIG. 1.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the addresses and the clock signal to the data storage circuit 2003 in order to control operations of the data storage circuit 2003. In addition, the memory controller 2002 may supply the data outputted from the data storage circuit 2003 to the host 2001. In an embodiment, for example, the memory controller 2002 may include the semiconductor device illustrated in FIG. 1.

The data storage circuit 2003 may include a plurality of memories. The data storage circuit 2003 may receive the data, the data strobe signal, the command, the addresses and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include the error correction circuit 20 illustrated in FIG. 1. In an embodiment, for example, the data storage circuit 2003 may include the semiconductor device illustrated in FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

What is claimed is:

1. A semiconductor device comprising:
an input/output (I/O) control circuit configured to delay a write signal by a delay time, which is set according to a logic level combination of an error correction fix signal and an error correction start signal, to generate a write enablement signal; and
an I/O circuit configured to output transfer data generated from input data as internal data based on the write enablement signal and configured to output a parity including error information on the input data as an internal parity based on the write enablement signal,
wherein the error correction fix signal is a signal for fixing the delay time regardless of an error correction operation and the error correction start signal is a signal executing the error correction operation.

2. The semiconductor device of claim 1,
wherein the delay time is set as a first delay time if a first mode is selected by a logic level combination of the error correction fix signal and the error correction start signal, and
wherein the delay time is set as a second delay time if a second mode or a third mode is selected by a logic level combination of the error correction fix signal and the error correction start signal.

3. The semiconductor device of claim 2, wherein the second delay time is set to be longer than the first delay time, and the second delay time is set to be equal to a time for generating the parity.

4. The semiconductor device of claim 2,
wherein the first mode is an operation mode in which the error correction operation for generating the parity is not performed,
wherein the second mode is an operation mode in which the error correction operation is performed, and
wherein the third mode is an operation mode for fixing the delay time regardless of execution of the error correction operation.

5. The semiconductor device of claim 1,
wherein the I/O control circuit includes:
a delay control signal generation circuit configured to generate a delay control signal which is enabled according to a logic level combination of the error correction fix signal and the error correction start signal; and
a delay control circuit configured to delay the write signal by the delay time, which is set according to a logic level of the delay control signal, to generate the write enablement signal.

6. The semiconductor device of claim 5,
wherein the delay control signal is selectively enabled according to a logic level of the error correction start signal if the error correction fix signal is disabled, and
wherein the delay control signal is enabled if the error correction fix signal is enabled.

7. The semiconductor device of claim 5, wherein the delay control circuit includes:
a write pulse generation circuit configured to generate a write pulse having a predetermined pulse width based on the write signal; and
a delay adjustment circuit configured to delay the write pulse by the delay time, which is set based on the delay control signal, to generate the write enablement signal.

8. The semiconductor device of claim 1,
wherein the semiconductor device further comprising:
an error correction circuit configured to output the input data as the transfer data based on the write signal and configured to generate the parity including error information on the input data based on the error correction start signal; and
a memory circuit configured to store the internal data into a bank selected according to a logic level combination of an address based on the write signal and configured to store the internal parity into a parity storage circuit based on the write signal.

9. The semiconductor device of claim 8, wherein the error correction circuit is configured to generate the parity if the error correction start signal is enabled and is configured not to generate the parity if the error correction start signal is disabled.

10. A semiconductor device comprising:
an input/output (I/O) control circuit configured to delay a write signal by a delay time, which is set according to a logic level combination of an error correction fix signal and an error correction start signal, to generate a write enablement signal or configured to delay a read signal by the delay time to generate a read strobe signal;
an error correction circuit configured to output input data as transfer data based on the write signal, configured to output a parity including error information on the input data based on the write signal, and configured to correct errors of internal data according to an internal parity to output the corrected internal data as the transfer data based on the read signal; and
an I/O circuit configured to output the transfer data as the internal data based on the write enablement signal, configured to output the parity as the internal parity based on the write enablement signal, and configured to output the internal data as output data based on the read strobe signal,
wherein the error correction fix signal is a signal for fixing the delay time regardless of an error correction operation and the error correction start signal is a signal executing the error correction operation.

11. The semiconductor device of claim 10,
wherein the error correction circuit is configured to output the input data as the transfer data based on the write signal and the error correction start signal, and is configured to output the parity including the error information on the input data based on the write signal and the error correction start signal,
wherein the delay time is set as a first delay time if a first mode is selected by a logic level combination of the error correction fix signal and the error correction start signal, and
wherein the delay time is set as a second delay time if a second mode or a third mode is selected by a logic level combination of the error correction fix signal and the error correction start signal.

12. The semiconductor device of claim 11, wherein the second delay time is set to be longer than the first delay time, and the second delay time is set to be equal to a time for generating the parity or a time for correcting errors of the internal data.

13. The semiconductor device of claim 11,
wherein the first mode is an operation mode in which the error correction operation for generating the parity and for correcting errors of the internal data is not performed,
wherein the second mode is an operation mode in which the error correction operation is performed, and
wherein the third mode is an operation mode for fixing the delay time regardless of execution of the error correction operation.

14. The semiconductor device of claim 10,
wherein the error correction circuit is configured to output the input data as the transfer data based on the write signal and the error correction start signal, and is configured to output the parity including the error information on the input data based on the write signal and the error correction start signal,
wherein the error correction circuit generates the parity and corrects errors of the internal data, if the error correction start signal is enabled, and
wherein the error correction circuit does not perform an operation for generating the parity and an operation for correcting errors of the internal data, if the error correction start signal is disabled.

15. The semiconductor device of claim 10,
wherein the error correction circuit is configured to output the input data as the transfer data based on the write signal and the error correction start signal, and is configured to output the parity including the error information on the input data based on the write signal and the error correction start signal, and
wherein the I/O control circuit includes:
a delay control signal generation circuit configured to generate a delay control signal which is enabled according to a logic level combination of the error correction fix signal and the error correction start signal; and
a delay control circuit configured to delay the write signal by the delay time, which is set according to a logic level of the delay control signal, to generate the write enablement signal and configured to delay the read signal by the delay time to generate the read strobe signal.

16. The semiconductor device of claim 15,
wherein the delay control signal is selectively enabled according to a logic level of the error correction start signal if the error correction fix signal is disabled, and
wherein the delay control signal is enabled if the error correction fix signal is enabled.

17. The semiconductor device of claim 15, wherein the
a write pulse generation circuit configured to generate a write pulse created during a predetermined period based on the write signal;
a read pulse generation circuit configured to generate a read pulse created during a predetermined period based on the read signal; and
a delay adjustment circuit configured to delay the write pulse by the delay time, which is set based on the delay control signal, to generate the write enablement signal and configured to delay the read pulse by the delay time, which is set based on the delay control signal, to generate the read strobe signal.

18. The semiconductor device of claim 17, wherein the delay adjustment circuit includes:
a first delay adjustment circuit configured to delay the write pulse by the delay time, which is set based on the delay control signal, to generate the write enablement signal; and
a second delay adjustment circuit configured to delay the read pulse by the delay time, which is set based on the delay control signal, to generate the read strobe signal.

19. The semiconductor device of claim 18,
wherein the delay time is set as a first delay time if the delay control signal is disabled, and
wherein the delay time is set as a second delay time if the delay control signal is enabled.

20. The semiconductor device of claim 10, wherein the I/O circuit includes:
a write driver configured to output the transfer data as the internal data and to output the parity as the internal parity, based on the write enablement signal; and a read driver configured to output the transfer data as the output data based on the read strobe signal.

* * * * *